United States Patent
Lin et al.

(10) Patent No.: US 8,049,650 B2
(45) Date of Patent: Nov. 1, 2011

(54) METHOD FOR TESTING A HIGH-SPEED DIGITAL TO ANALOG CONVERTER BASED ON AN UNDERSAMPLING TECHNIQUE

(75) Inventors: Chun-Wei Lin, Yunlin County (TW); Cheng-En Ho, Yunlin County (TW)

(73) Assignee: National Yunlin University of Science and Technology, Douliu, Yunlin County (TW)

( * ) Notice: Subject to any disclaimer, the term of this patent is extended or adjusted under 35 U.S.C. 154(b) by 0 days.

(21) Appl. No.: 12/727,522

(22) Filed: Mar. 19, 2010

(65) Prior Publication Data

US 2011/0227769 A1 Sep. 22, 2011

(51) Int. Cl.
*H03M 1/10* (2006.01)
(52) U.S. Cl. ............... 341/120; 341/155; 341/118
(58) Field of Classification Search .............. 341/118, 341/119, 120, 144
See application file for complete search history.

(56) References Cited

U.S. PATENT DOCUMENTS

| | | | | |
|---|---|---|---|---|
| 6,642,869 B2 * | 11/2003 | Kuyel et al. | ............... | 341/120 |
| 6,651,023 B2 * | 11/2003 | Mori et al. | ............... | 702/117 |
| 7,110,739 B2 * | 9/2006 | Braithwaite | ............... | 455/276.1 |
| 7,355,537 B2 * | 4/2008 | Lin | ............... | 341/120 |

\* cited by examiner

Primary Examiner — Jean Jeanglaude
(74) Attorney, Agent, or Firm — Muncy, Geissler, Olds & Lowe, PLLC

(57) ABSTRACT

A method for testing a digital to analog converter, which operates in an undersampling environment, wherein signals of a tested DAC and a signal generator are modulated by a PWM device and then processed by a digital processing circuit to generate a digital signal, whereby is formed a low-speed equivalent ADC. The signal generator is provided by uniform-distribution random test patterns, and the signal generator generates an uniform-distribution random analog signal to the equivalent ADC. Thereby, the test error caused by the non-ideality of the signal generator is corrected, and the tested circuit can work in a full speed.

3 Claims, 9 Drawing Sheets

METHOD FOR TESTING A HIGH-SPEED DIGITAL TO ANALOG CONVERTER BASED ON AN UNDERSAMPLING TECHNIQUE

FIELD OF THE INVENTION

The present invention relates to a method for testing a digital to analog converter, particularly to a method for testing a high-speed digital to analog converter by using an undersampling technique.

BACKGROUND OF THE INVENTION

In testing an analog circuit or a mixed-signal circuit, the measurement of analog signals is a big challenge because analog signals are likely to be affected by noise. Further, the accuracy and stability of sampling in the recipient side also directly influences the entire test result. From the viewpoint of signal processing, the analysis of the output test eigenvalues can be accelerated if the outputs are digitized signals. Besides, the digitized signals are less likely to be distorted during transmission. Moreover, the external ATE (Automatic Test Equipment) can also process the digitized signals more efficiently.

There have been sophisticated digital-circuit test methods widely applied to mass-produced chips. However, as great difference exists between different types of analog circuits or mixed-signal circuits, the test technology thereof still has much room to develop. A typical test method for a digital to analog converter (DAC) usually includes the following procedures: the analog output terminal of the tested DAC is connected to the input terminal of a measurement analog to digital converter (ADC); digital control signals are sent to the input terminal of the tested DAC; the measurement ADC digitizes the output voltage signals of the tested DAC and outputs digital signals for analysis. Such a method is a full-digital approach, wherein the generation and analysis of digital signals are undertaken by a digital processing unit. Nevertheless, this method can only apply to a chip simultaneously having ADC and DAC. However, many chips have only DAC. If it is only for testing DAC that high-speed and high-resolution ADC should be built in the chip, the cost of test will be too high, and the chip design will become more complicated.

SUMMARY OF THE INVENTION

The primary objective of the present invention is to propose a test method for a high-speed digital to analog converter, which provides an undersampling test environment for a high-speed digital to analog converter, and thereby provides the test method to be digitized and analyzed easily.

To achieve the abovementioned objective, the present invention uses an undersampling technique to test a high-speed digital to analog converter (DAC), wherein the tested DAC is integrated with other circuits to form an equivalent analog to digital converter (ADC) functioning as a low-speed test device and outputting low-speed parallel signals, and wherein a signal generator provides uniform-distribution random analog signals for the equivalent ADC to make the input signal and output signal have a piecewise linear relationship, whereby the signal generator can be calibrated at the same time, and whereby the tested circuit can work at a full speed, and whereby is corrected the test error resulting from the non-ideality of the signal generator.

The present invention has the following advantages: (1) The test circuit receives a triangular pattern and operates at the full speed to generate a low-frequency triangular-wave signal; (2) A signal generator provides a low-speed uniform-distribution random analog signal, and the equivalent ADC receives the analog signal from the input terminal thereof; the noise and the non-ideality of the signal generator are taken into consideration in correcting the test error caused by the inaccuracy of the signal generator; (3) The digitized test method of the present invention is easy to realize, and the eigenvalues are less likely to be interfered by noise, whereby is greatly promoted the test accuracy and obviously reduced the hardware resource the rear-end ATE requires.

DETAILED DESCRIPTION OF THE PREFERRED EMBODIMENTS

Below, the embodiments are described in detail in cooperation with the drawings to make easily understood the objectives, characteristics and efficacies of the present invention.

Figure 1A:
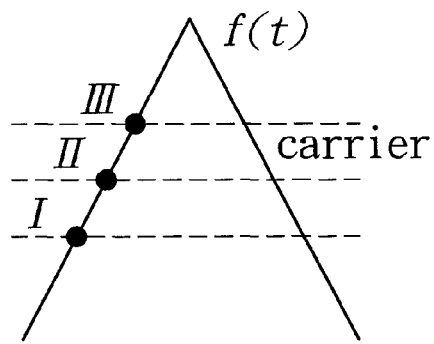
FIG. 1A and FIG. 1B are diagrams schematically showing an undersampling technique according to the present invention.
Figure 1B:
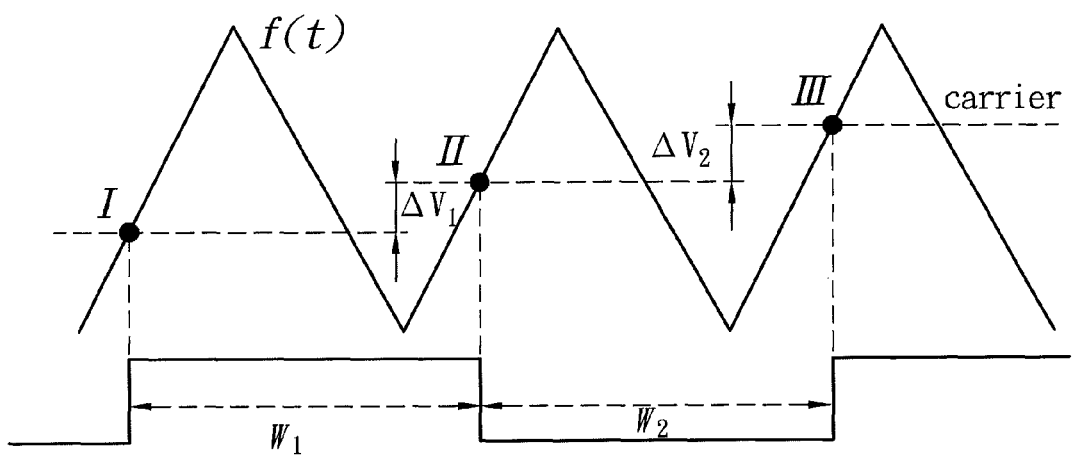

Refer to FIG. 1A and FIG. 1B diagrams schematically showing an undersampling technique for a high-speed DAC according to the present invention. As shown in FIG. 1A, there are three sampling points I, II and III. As shown in FIG. 1B, the three sampling points are respectively arranged in three cycles with the signal difference being $\Delta V_i$ and the difference of the pulse widths being $\Delta W_i$.

The method of the present invention needn't use a high-speed or high-resolution sampling hold circuit as a signal measurement circuit. The method of the present invention works in an undersampling mode and takes several sampling points or even a single sampling point within every cycle. Thus, the test circuit works in a very low frequency. The final test eigenvalue is the pulse width of digital signals, which is unlikely to be distorted during sampling. Therefore, the method of the present invention is particularly suitable to test DAC.

Figure 2:
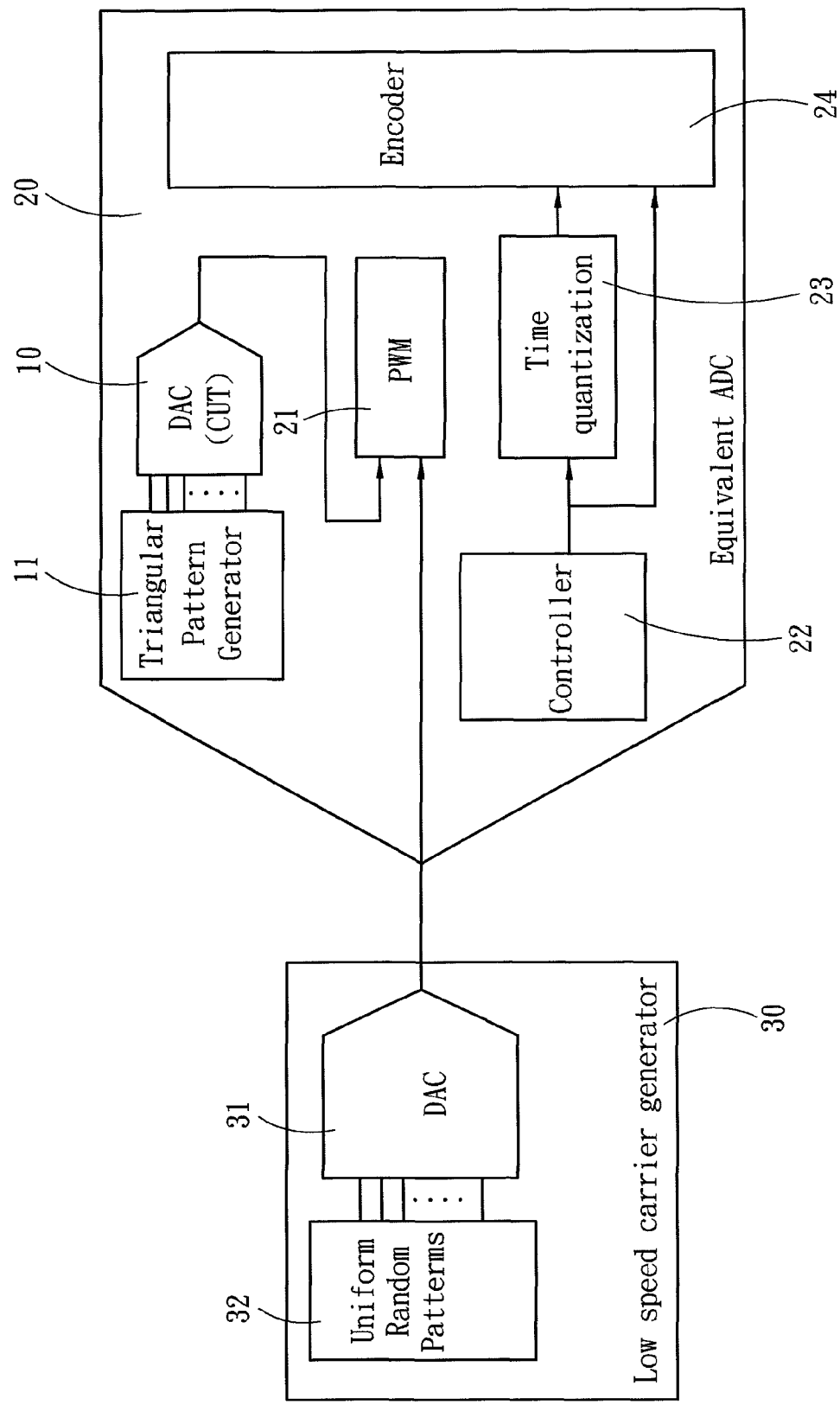
FIG. 2 is a diagram schematically showing a low speed equivalent test architecture according to the present invention.

Refer to FIG. 2. In the present invention, a tested DAC 10 is integrated with other circuits to form an equivalent ADC 20. The DAC 10 receives signals from a triangular pattern generator 11 and outputs an analog triangular wave signal functioning as the analog reference source of the equivalent ADC 20. The input terminal of the equivalent ADC 20 is connected to a signal generator 30. In the signal generator 30, a DAC 31 receives uniform-distribution random test patterns 32 and generates an analog output signal. The analog output signal and the analog triangular wave signal are modulated by a PWM (Pulse Width Modulation) device 21 and then pass through a synchronous control circuit 22, a digital processing circuit 23 and a modulation circuit 24. Consequently, the equivalent ADC 20 outputs low-speed digital signals.

The performance of the DAC 31 directly influences the precision of the signals output by the signal generator 30. The DAC 31 of the signal generator 30 is a non-ideal converter, and its non-ideality directly causes test errors.

Figure 3:
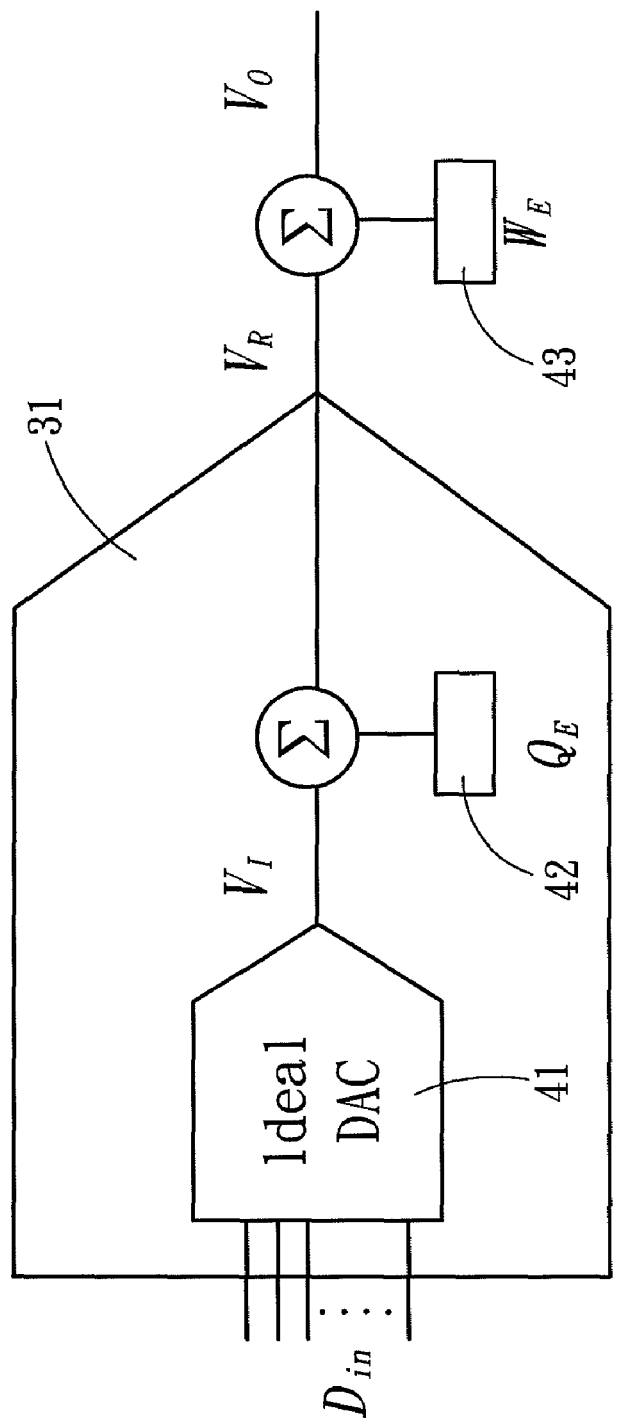
FIG. 3 is a diagram schematically showing an error model of a digital to analog converter according to the present invention.

Refer to FIG. 3 for an error model of the DAC 31, which involves an ideal DAC 41, a quantization error signal source 42, and a noise source 43. $D_{in}$ is a digital input signal; $V_I$ is an ideal analog output signal; $Q_E$ is a quantization error; $V_R$ is a real analog output signal; $w_E$ is a noise error; $V_O$ is an analog output signal received by the rear-end circuit. The quantization error signal is a random signal varying in a specified range and is usually expressed by a uniform-distribution random variable. In some cases, a Gaussian-distribution random variable can be used to replace the uniform-distribution random variable. The noise error is formed of a single error or several different types of noises. The noises may originate from the signal transmission path or switch of other circuits. The primary component of noises usually can be expressed by a Gaussian-distribution random variable.

Figure 4A:
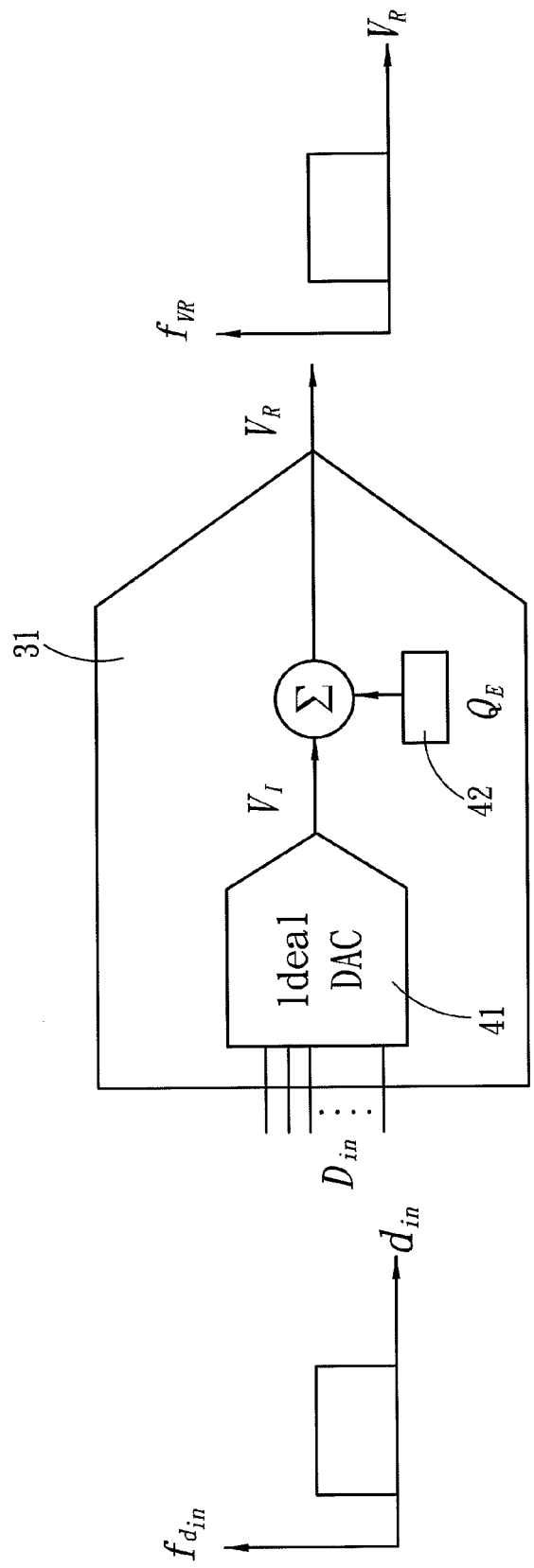
FIG. 4A is a diagram schematically showing the relationship of the output signals and the uniform-distribution input signal of DAC according to the present invention.

Refer to FIG. 4A. Suppose that the input signal sequence of the ideal DAC 41 is $\{D_{in}(n)=D_{in}(nT), n=0, 1, 2, 3 \ldots\}$, and that the corresponding output signal of the ideal DAC 41 is $V_I(n)$. Thus, the relationships of the signals of the DAC 31 can be expressed by $$\begin{cases} V_I(n) = D_{in}(n) \\ V_R(n) = V_I(n) + Q_E(n) = D_{in}(n) + Q_E(n) \\ V_O(n) = V_R(n) + w_E(n) = D_{in}(n) + Q_E(n) + w_E(n) \end{cases} \quad (1)$$

Figure 4B:
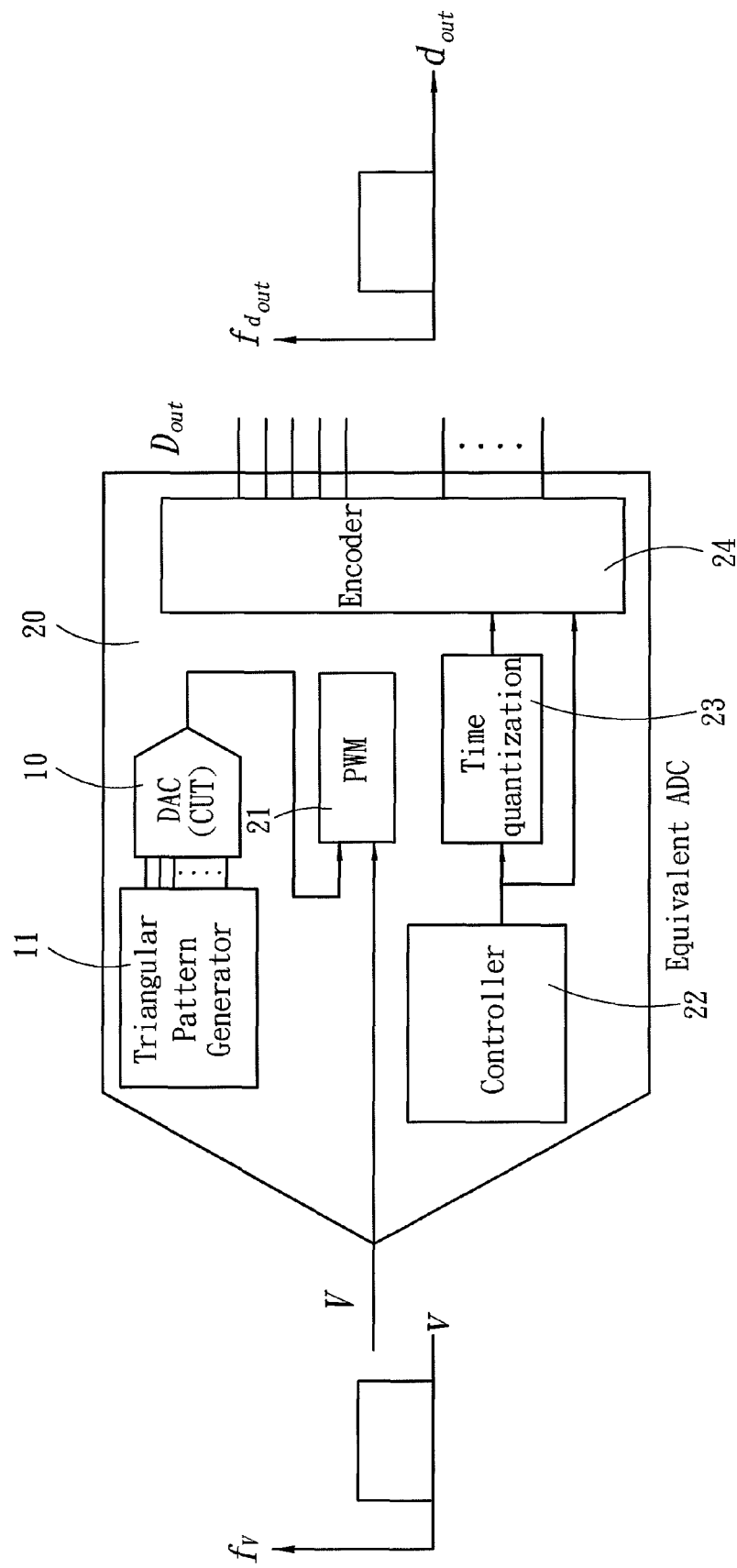
FIG. 4B is a diagram schematically showing the relationship of the output signals and the uniform-distribution input signal of ADC according to the present invention.

Refer to FIG. 4B. Suppose that the signals inputted to the tested DAC 10 are uniform-distribution random signals $D_{in} \sim U(a,b)$. Thus, the cumulative distribution function thereof can be expressed by:

$$F_{D_{in}}(d_{in}) = P(D_{in} \leq d_{in}) = Y \quad (2)$$

wherein $-\infty < d_{in} < \infty$, $0 < y < 1$.

According to the theorem of probability $F_Y(y)=P(Y \leq y)=y$, the cumulative distribution function of probability of the random variable $D_{in}$ should be equal to that of the transformed variable Y thereof. Therefore, $$F_Y(y) = y \quad (3)$$

$$= F_{D_{in}}(d_{in})$$

$$= P(D_{in} \leq d_{in})$$

-continued $$= \int_a^{d_{in}} \frac{1}{b-a} dD_{in}$$

$$= \frac{d_{in} - a}{b-a}$$

$$= \frac{\Delta D_{in}}{b-a}$$

According to Equations (2) and (3), $$Y = \frac{\Delta D_{in}}{b-a}. \quad (4)$$

Similarly, the relationship between Y and the random output signal $V_R$ is:

$$Y = \frac{\Delta V_R}{c-d}. \quad (5)$$

According to Equations (4) and (5), the linear equation thereof can be expressed by:

$$E[\Delta D_{in}] = k \cdot E[\Delta V_R] \quad (6)$$

A similar deduction can obtain the linear relationship of the average input and average output of the equivalent ADC 20:

$$E[\Delta V] = k \cdot E[\Delta D_{out}] \quad (7)$$

Figure 5:
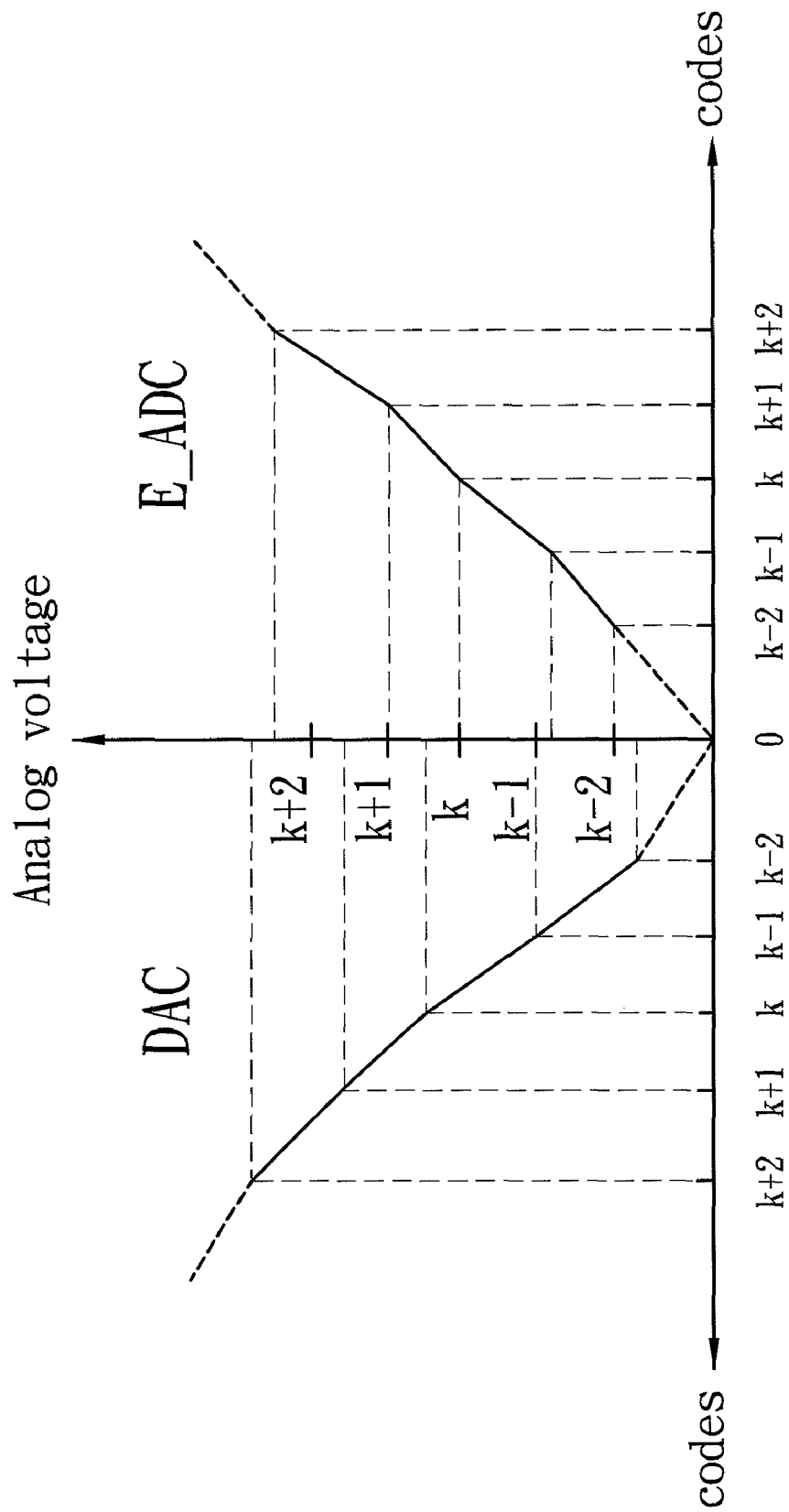
FIG. 5 is a diagram schematically showing a piecewise linear relationship obtained with the uniform-distribution signal according to the present invention.

Refer to FIG. 5 a diagram showing a piecewise linear relationship of the analog voltage signal and the digital code of the DAC 31 and the equivalent ADC 20 (E_ADC).

Figure 6:
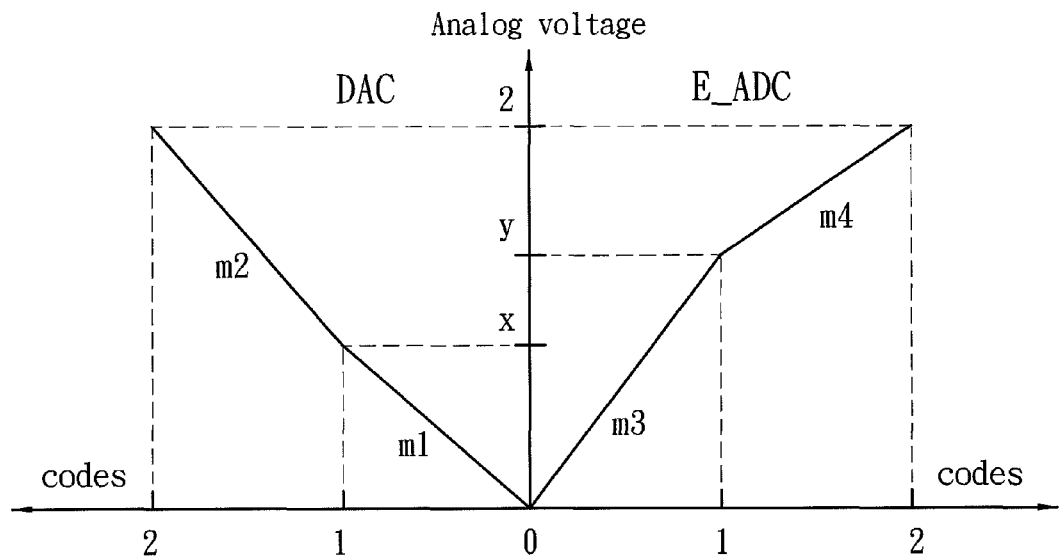
FIG. 6 is a diagram schematically showing a linear relationship when the transition voltage of DAC is smaller than that of an equivalent ADC according to the present invention.
Figure 7:
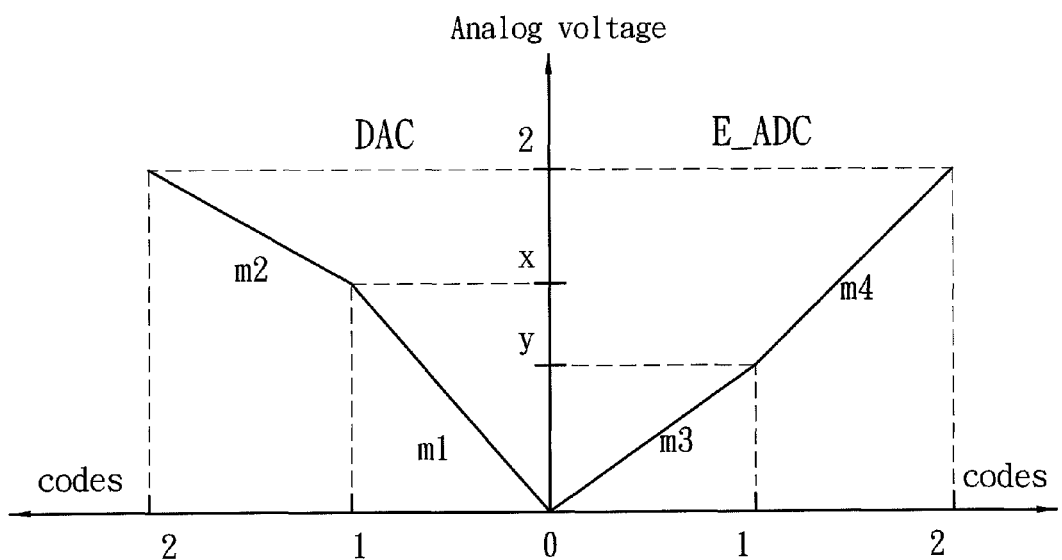
FIG. 7 is a diagram schematically showing a linear relationship when the transition voltage of DAC is greater than that of an equivalent ADC according to the present invention.

Refer to FIG. 6 and FIG. 7. When signals are transferred in the pair of the DAC 31 and the E_ADC 20, the quantization errors of DAC 31 and the E_ADC 20 result in two cases. Suppose that the output patterns of the E_ADC 20 have an average of k. Thus, the transition voltage of the DAC 31 may be smaller or greater than that of the E_ADC 20, as shown in FIG. 6 and FIG. 7. The data shown in FIG. 5 is simplified into three states shown in FIG. 6 and FIG. 7 via normalizing the digital code greater than the (k+1)th digital code to be 2, normalizing the kth digital code to be 1, and normalizing the digital code smaller than the (k−1)th code to be 0.

In FIG. 6, x and y are respectively the transition voltages of the DAC 31 and the E_ADC 20; m1, m2, m3 and m4 are respectively the slopes of the four piecewise linear relationships after normalization. With the transition voltages of the DAC 31 and the E_ADC 20 being the parameters, the slopes can be expressed as:

$$\begin{cases} m1 = x \\ m2 = 2 - x \\ m3 = \dfrac{1}{y} \\ m4 = \dfrac{1}{2-y} \end{cases}$$

From FIG. 7, the relationship $$\frac{dout}{din}$$

of the output code of E_ADC 20 and the input code of DAC 31 may have three possibilities respectively m1×m3, m2×m3, and m2×m4, which may be expressed by:

$$\begin{bmatrix} m1 \times m3 = \dfrac{x}{y} \\ m2 \times m3 = \dfrac{2-x}{y} \\ m2 \times m4 = \dfrac{2-x}{2-y} \end{bmatrix}$$

Solve the simultaneous equations and then the transition voltage y can be expressed by:

$$y = \dfrac{2}{m1 * m3 + m2 * m3} \quad (A)$$

For $$\dfrac{dout}{din}$$

corresponding to m1×m3, E[din]≦1, and E[dout]≦1.
For $$\dfrac{dout}{din}$$

corresponding to m2×m3, E[din]≧1, and E[dout]≦1.

Similarly, it is known from FIG. 7 that the transition voltage of the other case can be expressed by:

$$y = 2 - \dfrac{2}{m1 * m4 + m2 * m4} \quad (B)$$

For $$\dfrac{dout}{din}$$

corresponding to m1×m4, E[din]≦1, and E[dout]≧1.
For $$\dfrac{dout}{din}$$

corresponding to m2×m4, E[din]≧1, and E[dout]≧1.

Figure 8:
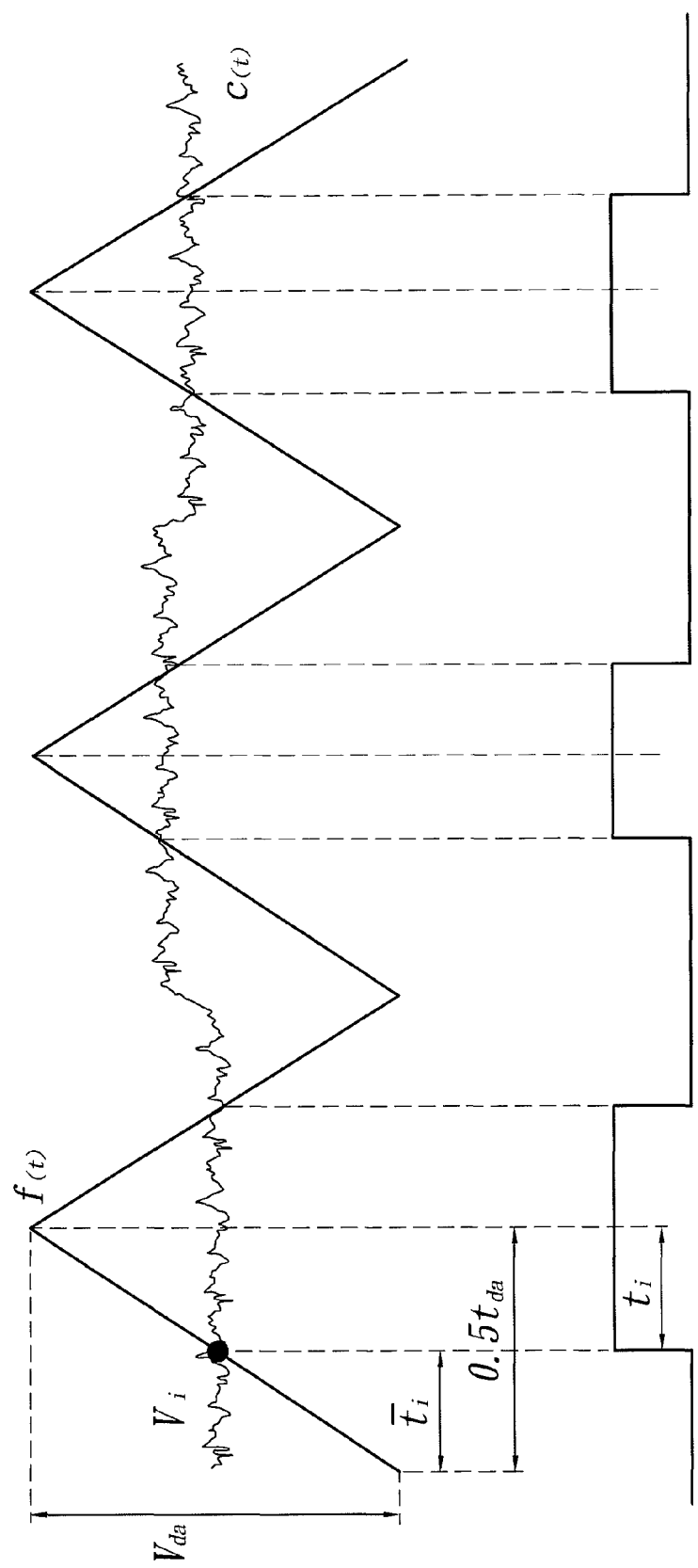
FIG. 8 is a diagram schematically showing a tested triangular wave signal and a uniform-distribution random carrier signal according to the present invention.

Refer to FIG. 8. The present invention uses the triangular pattern generator 11 to make the tested DAC 10 outputs a triangular wave signal f(t) and controls the triangular pattern generator 11 to generate a carrier wave c(t) having uniform-distribution random signals. c(t) is a low-speed uniform-distribution carrier wave signal, and the period thereof involves all the effects of noise. Thus, the influences of noise can be handled at the same time.

In FIG. 8, $V_{da}$ and $t_{da}$ are respectively the amplitude and period of the signal outputted by the tested DAC 10. $V_i$ is the intersection of the carrier wave signal and the signal outputted by the tested DAC 10. $t_i$ is the pulse width generated by pulse width modulation. The carrier wave signal can be expressed by:

$$c(t) = V_i + n(t)$$

wherein i=1, 2, 3, . . . , m.

From the triangular proportional relationship can be deduced the following equation:

$$\dfrac{\bar{t}_i}{0.5 t_{da}} = \dfrac{V_i + n(t)}{V_{da}}$$

$$1 - \dfrac{t_i}{0.5 t_{da}} = \dfrac{V_i + n(t)}{V_{da}}$$

$$t_i = \left(1 - \dfrac{V_i + n(t)}{V_{da}}\right) \times 0.5 t_{da}$$

$V_i$ is a random variable. Suppose that the average of $V_i$ is $E[V_i] = M_c$, and that the average of the noise effects is zero. Thus, the preceding equation may be revised to be:

$$E[t_i] = \left(1 - \dfrac{M_c}{V_{da}}\right) \times 0.5 t_{da} = \overline{M}_t$$

Suppose that the slope of the triangular wave of the tested signal is normalized to be 1. The relationship of the average pulse width of the PWM signal and the average of the carrier wave signal can be expressed by:

$$\overline{M}_t = (0.5 t_{da} - M_c)$$

which shows a linear relationship between the average pulse width of the PWM signal and the average of the carrier wave signal.
Suppose $$M_t = 0.5 t_{da} - \overline{M}_t,$$

and quantize the pulse width. Thus, the average of the quantized digital codes $M_d$ can be expressed by:

$$M_d = \text{Quant}(M_t).$$

Suppose that the tested DAC 10 is an n-bits converter and has an operation period of $t_{cut}$. Thus, the amplitude of the tested signal totally has ($2^n-1$) quantization intervals within the interval of (0-$V_{da}$). The semi-period of the tested signal has ($2^n-1$) time sections within the interval of (0-$0.5 t_{da}$). The average of the carrier wave signals will vary within the ($2^n-1$) quantization intervals. The pulse width of the PWM signal is quantized according to its distribution within the ($2^n-1$) time sections. Thus is formed an n-bits equivalent ADC 20.

Figure 9:
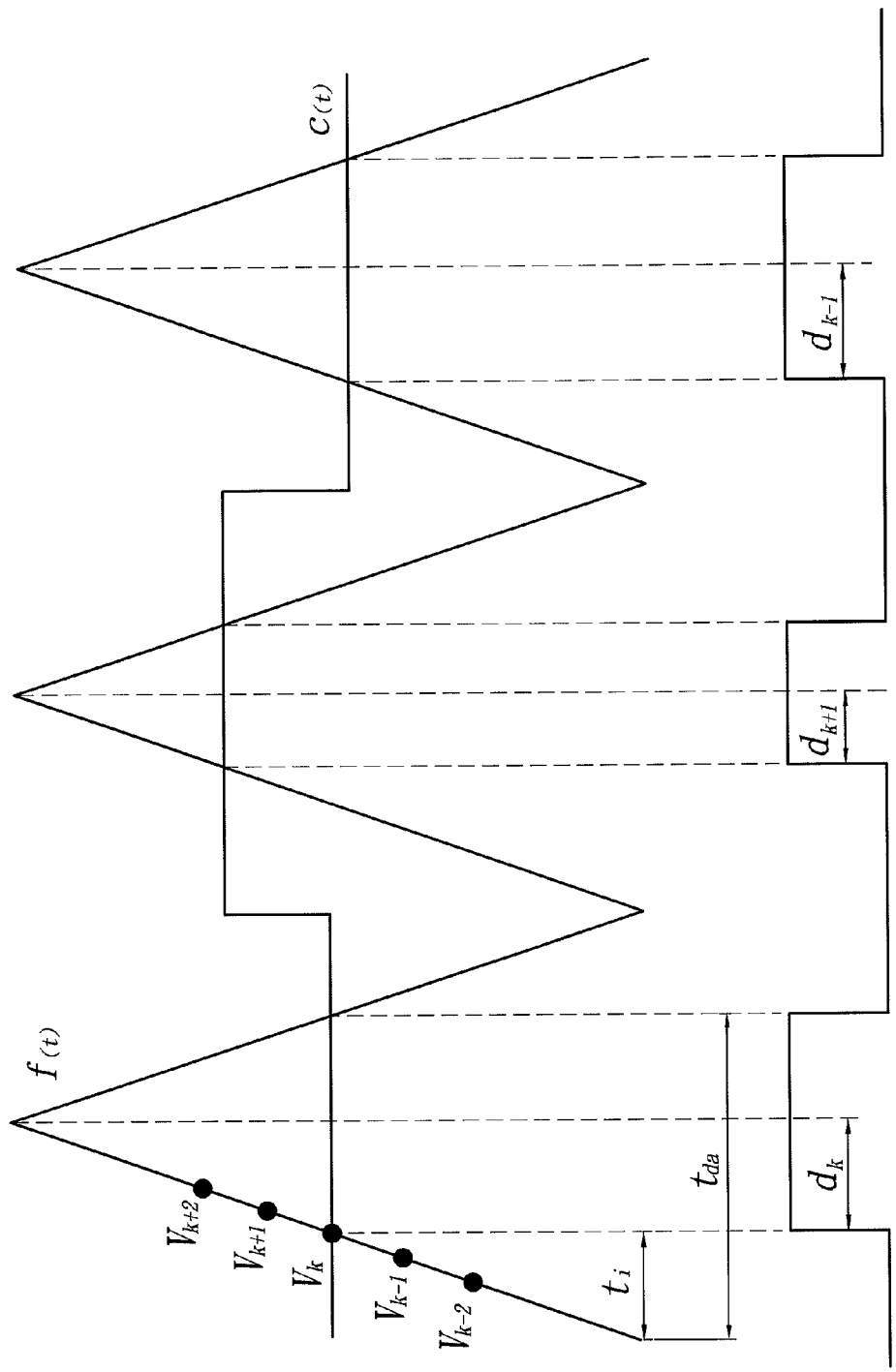
FIG. 9 is a diagram schematically showing the relationship of the nonlinear errors between the tested DAC and the equivalent ADC according to the present invention.

Refer to FIG. 9. Suppose that the nonlinear error of a specific code of the tested DAC 10 causes the intersection of the signal outputted by the tested circuit and the carrier wave signal to increase from $V_i$ to $V_i + \Delta$. Thus, the quantized pulse width also increases from $M_t$ to $M_t + \Delta$. In other words, the nonlinear error of the tested DAC 10 is parallel to the nonlinear error of the equivalent ADC 20. FIG. 9 shows the corresponding relationship therebetween. Suppose that the carrier wave inputted to the equivalent ADC 20 is controlled to vary within $v_{k-2} \sim v_{k+2}$ and has an average of $v_k$. Thus, the output code of the equivalent ADC 20 will vary within $d_{k-2} \sim d_{k+2}$ correspondingly. Suppose that the signal generator 30 and the tested DAC 10 are both ideal circuit. Then, the output codes of the equivalent ADC 20 has an average of $d_k$.

In fact, the tested DAC 10 is not an ideal converter, and the corresponding equivalent ADC 20 is not ideal either. If the quantization interval ($v_k$, $v_{k+1}$) becomes smaller and the quantization interval ($v_{k+1}$, $v_{k+2}$) becomes larger, the equivalent ADC 20 outputs $d_k$ more frequently and outputs $d_{k+1}$ less frequently. Thus, the average of the output codes will slightly increases, and the variation of the average of the output codes is proportional to the variation of the quantization intervals of the tested DAC 10. Hereinbefore, the present invention has proposed an error-offset method by inputting different signals, wherein DAC and E_ADC have a piecewise linear relationship for random signals, and wherein two sets of carrier waves having different averages are input to obtain two sets of corresponding piecewise linear relationships. Via solving the simultaneous equations, the non-ideality of the carrier wave generator is removed, and the nonlinearity of the equivalent ADC 20 is obtained. The nonlinear error of the tested DAC 10 is corresponding to the nonlinear error of the equivalent ADC 20. Thus is obtained the nonlinear error of the tested DAC 10.

In the present invention, uniform-distribution digital codes within an appropriate interval are inputted to the DAC 31 of the signal generator 30, and signals are collected from the output terminal of the equivalent ADC 20 and the averages E[din] and E[dout] are used to determine the relationship of the transition voltages. Then, the transition voltage of the equivalent ADC 20 is obtained according to Equations (A) or (B). In other words, the uniform-distribution random input signals together with the mathematic method are used to assess the transition voltage of the equivalent ADC 20, including the influence of the nonlinear error of the DAC 31 of the signal generator 30. The test result can thus be deduced from the relationship of the nonlinear errors of the equivalent ADC 20 and the tested DAC 10, which has been worked out in the present invention.

What is claimed is:

1. A method for testing a high-speed digital to analog converter based on an undersampling technique, comprising:
    providing a tested digital to analog converter integrated with a triangular pattern generator, a PWM device, a synchronous control circuit, a digital processing circuit, and a modulation circuit to form an equivalent analog to digital converter;
    deducing a piecewise relationship of an input of a signal generator comprising a digital to analog converter and an output of the equivalent analog to digital converter;
    the signal generator generating a uniform-distribution random analog output signal to the equivalent analog to digital converter;
    collecting signals from an output terminal of the equivalent analog to digital converter, and substituting the signals into the piecewise relationship to obtain a transition voltage of the equivalent analog to digital converter;
    calculating nonlinearity of the equivalent analog to digital converter to obtain a nonlinear error of the tested digital to analog converter;
    deducing a test result of the tested digital-analog converter from the transition voltage and a nonlinear error of the equivalent analog to digital converter and the nonlinear error of the tested digital to analog converter.

2. The method for testing a high-speed digital to analog converter based on an undersampling technique according to claim 1, wherein a triangular pattern generator generates signals to the tested digital to analog converter, and the tested digital to analog converter outputs an analog triangular wave signal functioning as a reference analog signal of the equivalent analog to digital converter; an input terminal of the equivalent analog to digital converter is connected to the signal generator; the signal generator receives uniform-distribution random patterns via the digital to analog converter and then generates the uniform-distribution random analog output signal; the analog output signal and the analog triangular wave signal are modulated by a pulse-width-modulation device, and processed by a synchronous control circuit, a digital processing circuit and a modulation circuit; the equivalent analog to digital converter then outputs an undersampling digital signal.

3. A method for testing a high-speed digital to analog converter, comprising:
    providing a tested digital to analog converter integrated with a triangular pattern generator, a PWM device, a synchronous control circuit, a digital processing circuit, and a modulation circuit to form an equivalent analog to digital converter;
    deducing a piecewise relationship of an input of a signal generator comprising a digital to analog converter and an output of the equivalent analog to digital converter;
    the signal generator generating a uniform-distribution random analog output signal to the equivalent analog to digital converter;
    collecting signals from an output terminal of the equivalent analog to digital converter, and substituting the signals into the piecewise relationship to obtain a transition voltage of the equivalent analog to digital converter;
    calculating nonlinearity of the equivalent analog to digital converter to obtain a nonlinear error of the tested digital to analog converter;
    deducing a test result of the tested digital-analog converter from the transition voltage and a nonlinear error of the equivalent analog to digital converter and the nonlinear error of the tested digital to analog converter.

* * * * *